US010141222B2

(12) United States Patent
Lin et al.

(10) Patent No.: US 10,141,222 B2
(45) Date of Patent: Nov. 27, 2018

(54) SEMICONDUCTOR DEVICE AND METHOD OF FORMING CONDUCTIVE VIAS THROUGH INTERCONNECT STRUCTURES AND ENCAPSULANT OF WLCSP

(71) Applicant: STATS ChipPAC, Ltd., Singapore (SG)

(72) Inventors: Yaojian Lin, Singapore (SG); Pandi C. Marimuthu, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 74 days.

(21) Appl. No.: 14/566,870

(22) Filed: Dec. 11, 2014

(65) Prior Publication Data

US 2015/0091145 A1    Apr. 2, 2015

Related U.S. Application Data

(63) Continuation of application No. 12/724,354, filed on Mar. 15, 2010, now Pat. No. 8,951,839.

(51) Int. Cl.
*H01L 21/768* (2006.01)
*H01L 23/498* (2006.01)
(Continued)

(52) U.S. Cl.
CPC ...... *H01L 21/76829* (2013.01); *H01L 21/486* (2013.01); *H01L 21/4832* (2013.01);
(Continued)

(58) Field of Classification Search
CPC ......... H01L 21/76877; H01L 21/76879; H01L 23/485; H01L 23/481; H01L 21/4832; H01L 21/486
See application file for complete search history.

(56) References Cited

U.S. PATENT DOCUMENTS 5,250,843 A    10/1993 Eichelberger
5,353,498 A    10/1994 Fillion et al.
(Continued)

FOREIGN PATENT DOCUMENTS

CN    1491439 A    4/2004
TW    201034537 A    9/2010
WO    9836624 A2    8/1998

*Primary Examiner* — Daniel Luke
(74) *Attorney, Agent, or Firm* — Robert D. Atkins; Patent Law Group: Atkins and Associate, P.C.

(57) ABSTRACT

A semiconductor device has a semiconductor die mounted over the carrier. An encapsulant is deposited over the carrier and semiconductor die. The carrier is removed. A first interconnect structure is formed over the encapsulant and a first surface of the die. A second interconnect structure is formed over the encapsulant and a second surface of the die. A first protective layer is formed over the first interconnect structure and second protective layer is formed over the second interconnect structure prior to forming the vias. A plurality of vias is formed through the second interconnect structure, encapsulant, and first interconnect structure. A first conductive layer is formed in the vias to electrically connect the first interconnect structure and second interconnect structure. An insulating layer is formed over the first interconnect structure and second interconnect structure and into the vias. A discrete semiconductor component can be mounted to the first interconnect structure.

25 Claims, 10 Drawing Sheets

(51) Int. Cl.
*H01L 23/538* (2006.01)
*H01L 21/48* (2006.01)
*H01L 21/56* (2006.01)
*H01L 23/00* (2006.01)
*H05K 1/18* (2006.01)

(52) U.S. Cl.
CPC ...... *H01L 21/568* (2013.01); *H01L 21/76879* (2013.01); *H01L 23/49816* (2013.01); *H01L 23/49827* (2013.01); *H01L 23/49861* (2013.01); *H01L 23/5389* (2013.01); *H01L 24/19* (2013.01); *H01L 24/20* (2013.01); *H05K 1/185* (2013.01); H01L 24/11 (2013.01); H01L 2224/0401 (2013.01); H01L 2224/04105 (2013.01); H01L 2224/06182 (2013.01); H01L 2224/1132 (2013.01); H01L 2224/11334 (2013.01); H01L 2224/11462 (2013.01); H01L 2224/11464 (2013.01); H01L 2224/11849 (2013.01); H01L 2224/11901 (2013.01); H01L 2224/12105 (2013.01); H01L 2224/131 (2013.01); H01L 2224/13111 (2013.01); H01L 2224/13113 (2013.01); H01L 2224/13116 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/20 (2013.01); H01L 2224/2101 (2013.01); H01L 2224/211 (2013.01); H01L 2224/215 (2013.01); H01L 2224/221 (2013.01); H01L 2924/01004 (2013.01); H01L 2924/014 (2013.01); H01L 2924/01006 (2013.01); H01L 2924/01013 (2013.01); H01L 2924/01029 (2013.01); H01L 2924/01047 (2013.01); H01L 2924/01073 (2013.01); H01L 2924/01078 (2013.01); H01L 2924/01079 (2013.01); H01L 2924/01082 (2013.01); H01L 2924/01322 (2013.01); H01L 2924/09701 (2013.01); H01L 2924/12041 (2013.01); H01L 2924/12042 (2013.01); H01L 2924/1306 (2013.01); H01L 2924/13091 (2013.01); H01L 2924/14 (2013.01); H01L 2924/181 (2013.01); H05K 2201/10674 (2013.01)

(56) References Cited

U.S. PATENT DOCUMENTS

| | | | |
|---|---|---|---|
| 5,841,193 | A | 11/1998 | Eichelberger |
| 6,002,169 | A | 12/1999 | Chia et al. |
| 6,119,338 | A * | 9/2000 | Wang ................... H05K 3/4069 174/261 |
| 7,045,391 | B2 | 5/2006 | Lin |
| 7,321,164 | B2 | 1/2008 | Hsu |
| 7,507,915 | B2 | 3/2009 | Chang et al. |
| 7,605,019 | B2 | 10/2009 | Simon et al. |
| 7,619,901 | B2 | 11/2009 | Echelberger et al. |
| 8,138,026 | B2 | 3/2012 | Abbott |
| 8,183,677 | B2 | 5/2012 | Meyer-Berg |
| 8,358,016 | B2 | 1/2013 | Suh et al. |
| 8,466,542 | B2 | 6/2013 | Kriman et al. |
| 8,502,353 | B2 | 8/2013 | Akram et al. |
| 2004/0178495 | A1 | 9/2004 | Yean et al. |
| 2004/0227227 | A1* | 11/2004 | Imanaka ............. H01L 21/4857 257/700 |
| 2006/0205182 | A1* | 9/2006 | Soejima ................. H01L 21/78 438/460 |
| 2007/0077747 | A1 | 4/2007 | Heck et al. |
| 2007/0085188 | A1 | 4/2007 | Chang et al. |
| 2007/0212865 | A1* | 9/2007 | Amrine ................ H05K 3/4069 438/597 |
| 2008/0044944 | A1 | 2/2008 | Wakisaka et al. |
| 2009/0032966 | A1 | 2/2009 | Lee et al. |
| 2009/0072384 | A1 | 3/2009 | Wong et al. |
| 2009/0155956 | A1 | 6/2009 | Pohl et al. |
| 2009/0170241 | A1 | 7/2009 | Shim et al. |
| 2009/0239336 | A1 | 9/2009 | Lee et al. |
| 2009/0267194 | A1 | 10/2009 | Chen |
| 2009/0283872 | A1 | 11/2009 | Lin et al. |
| 2009/0283898 | A1 | 11/2009 | Janzen et al. |
| 2009/0294899 | A1 | 12/2009 | Pagaila et al. |
| 2010/0133682 | A1 | 6/2010 | Meyer |
| 2010/0144101 | A1 | 6/2010 | Chow et al. |
| 2010/0148340 | A1 | 6/2010 | Takano et al. |
| 2010/0163168 | A1 | 7/2010 | Saita et al. |
| 2010/0301460 | A1* | 12/2010 | Zhang ................... H01L 21/563 257/622 |
| 2011/0204505 | A1 | 8/2011 | Pagaila et al. |

* cited by examiner

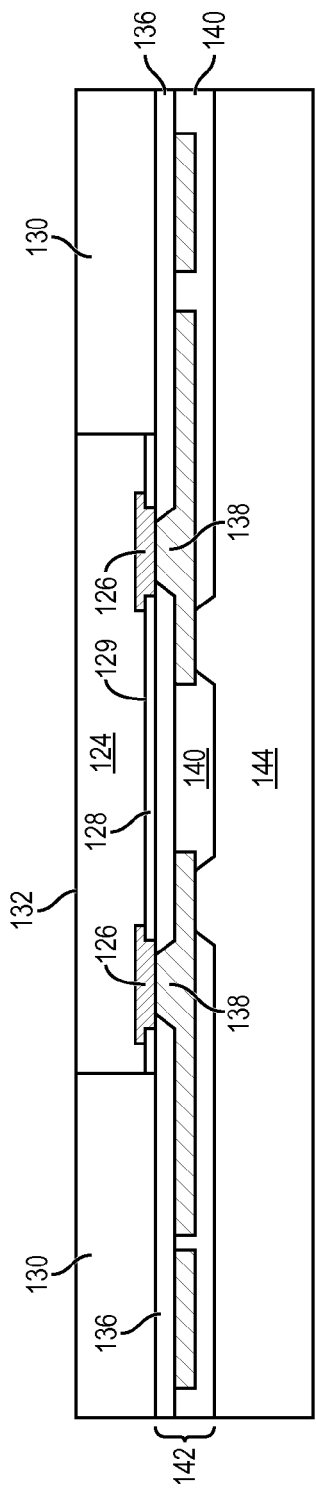
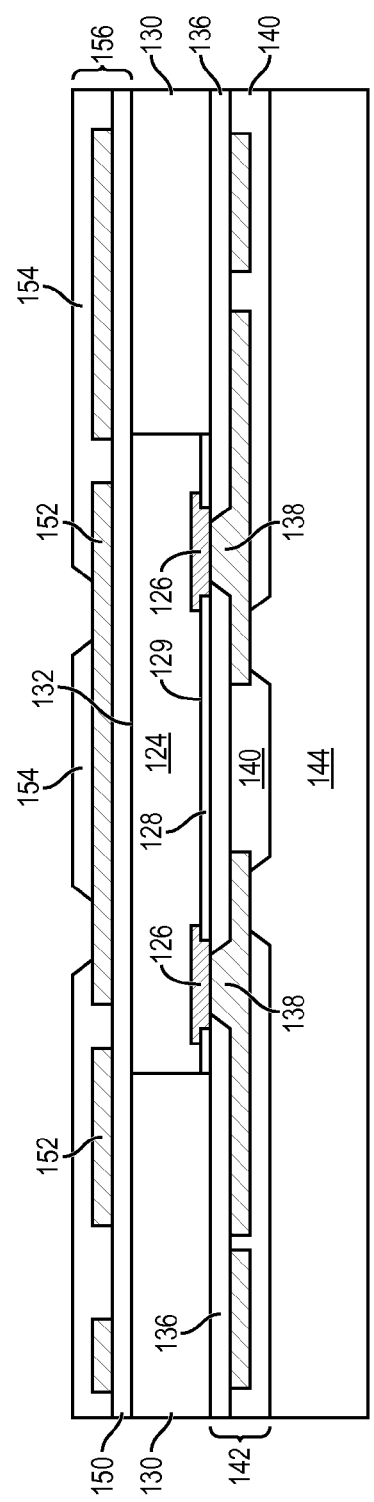

SEMICONDUCTOR DEVICE AND METHOD OF FORMING CONDUCTIVE VIAS THROUGH INTERCONNECT STRUCTURES AND ENCAPSULANT OF WLCSP

CLAIM TO DOMESTIC PRIORITY

The present application is a continuation of U.S. patent application Ser. No. 12/724,354, now U.S. Pat. No. 8,951,839, filed Mar. 15, 2010, which application is incorporated herein by reference.

FIELD OF THE INVENTION

The present invention relates in general to semiconductor devices and, more particularly, to a semiconductor device and method of forming conductive vias through first and second interconnect structures and encapsulant of a wafer level chip scale package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices often require vertical interconnect structures, for example, when stacking devices for efficient integration. The electrical interconnection between semiconductor devices, such as fan-out wafer level chip scale package (FO-WLCSP) containing semiconductor die, on multiple levels and external devices can be accomplished with conductive through silicon vias (TSV), conductive through hole vias (THV), conductive through mold vias (TMV), Cu-plated conductive pillars, and conductive bumps. These vertical interconnect structures often use laser drilling to form vias, followed by filling the vias with conductive material and single plating for redistribution layers in the upper and lower build-up interconnect structures. The requisite manufacture process is costly and time consuming.

SUMMARY OF THE INVENTION

A need exists for a simple and cost-effective process to form conductive vias in a WLCSP. Accordingly, in one embodiment, the present invention is a method of manufacturing a semiconductor device comprising the steps of providing a semiconductor die, forming a first interconnect structure over the semiconductor die, forming a second interconnect structure over the semiconductor die, forming a protective layer over the second interconnect structure, forming a via through the protective layer and second interconnect structure, removing the protective layer, and forming a first conductive layer in the via.

In another embodiment, the present invention is a method of manufacturing a semiconductor device comprising the steps of providing a semiconductor die, forming a first interconnect structure over the semiconductor die, forming a protective layer over the first interconnect structure, forming a via through the protective layer and first interconnect structure, removing the protective layer, and forming a first conductive layer in the via.

In another embodiment, the present invention is a method of manufacturing a semiconductor device comprising the steps of providing a semiconductor die, forming a first interconnect structure over the semiconductor die, forming a protective layer over the first interconnect structure with a via extending through the protective layer, and forming a plurality of conductive layers within the via and over the first interconnect structure.

In another embodiment, the present invention is a semiconductor device comprising a semiconductor die. A first interconnect structure is disposed over the semiconductor die. A removable protective layer is formed over the first interconnect structure. A via is formed through the first interconnect structure and removable protective layer.

BRIEF DESCRIPTION OF THE DRAWINGS

FIGS. 3a-3j illustrate a process of forming conductive vias from the top-side of a WLCSP;

DETAILED DESCRIPTION OF THE DRAWINGS

Figure 1:
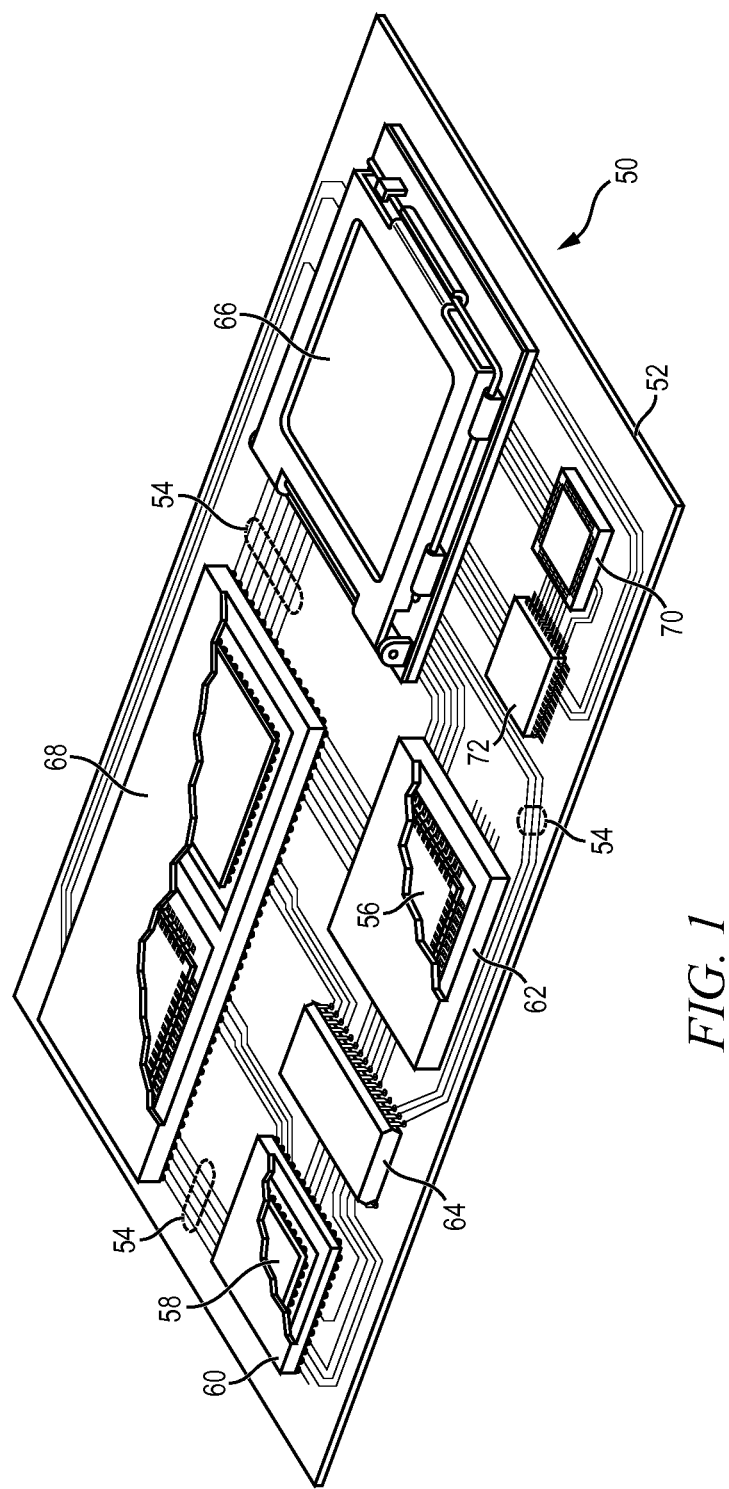
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
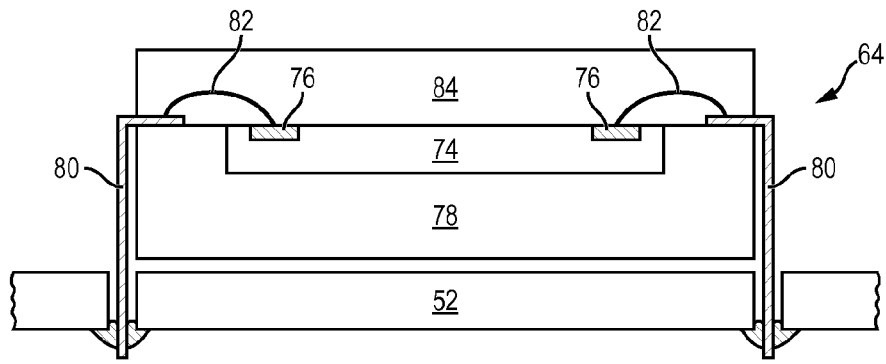
FIGS. 2a-2c illustrate further detail of the semiconductor packages mounted to the PCB.
Figure 2B:
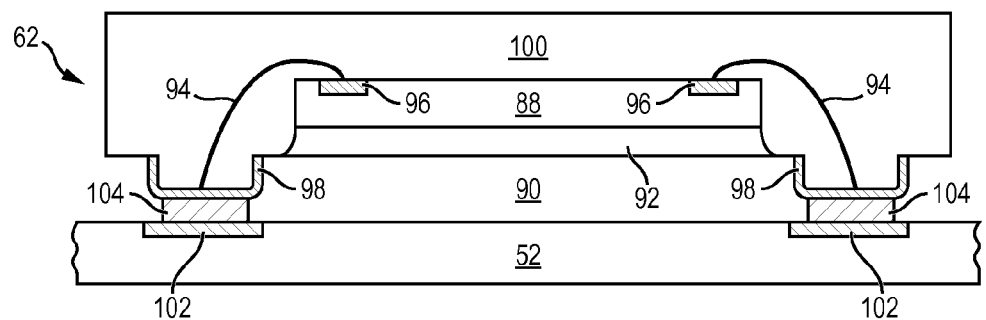
Figure 2C:
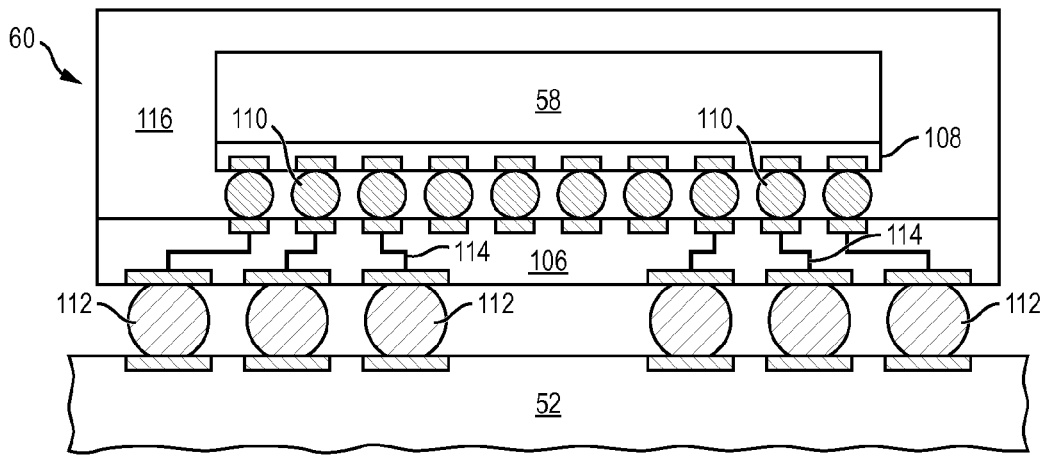

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
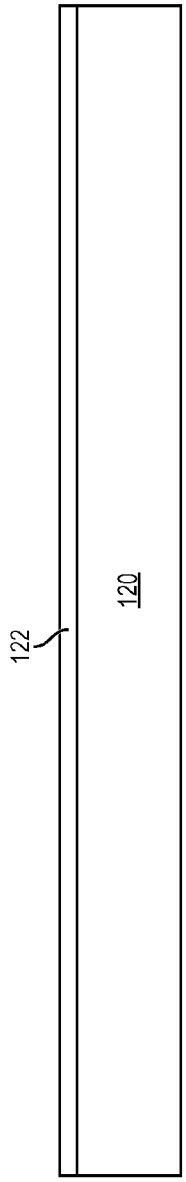

FIGS. 3a-3j illustrate a process of forming conductive vias from the top-side of a WLCSP. In FIG. 3a, a substrate or carrier 120 contains temporary or sacrificial base material such as silicon, polymer, polymer composite, metal, ceramic, glass, glass epoxy, beryllium oxide, or other suitable low-cost, rigid material for structural support. An optional interface layer 122 is formed over carrier 120 as a temporary adhesive bonding layer releasable with ultraviolet (UV) light or heat.

Figure 3B:
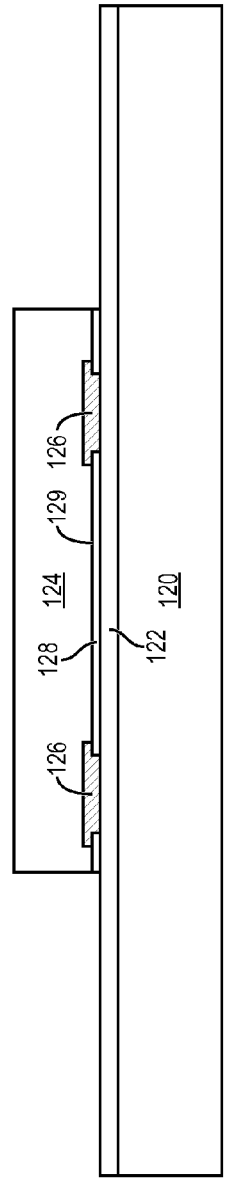

In FIG. 3b, semiconductor die or component 124 is mounted to interface layer 122 with contact pads 126 and dielectric layer 128 oriented to carrier 120. Semiconductor die 124 is a known good unit (KGU) having been electrically and mechanically tested to comply with design specifications. Semiconductor die 124 has an active surface 129 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 129 to implement analog circuits or digital circuits, such as digital signal processor (DSP), ASIC, memory, or other signal processing circuit. Semiconductor die 124 may also contain IPDs, such as inductors, capacitors, and resistors, for RF signal processing. In another embodiment, a discrete semiconductor component can be mounted to interface layer 122 and carrier 120.

Figure 3C:
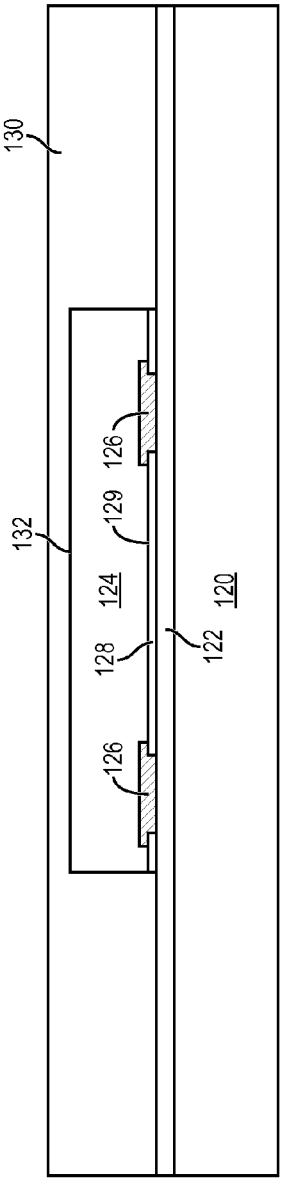

FIG. 3c shows an encapsulant or molding compound 130 is deposited over semiconductor die 124 and carrier 120 using a paste printing, compressive molding, transfer molding, liquid encapsulant molding, vacuum lamination, or other suitable applicator. Encapsulant 130 can be epoxy resin with filler, epoxy acrylate with filler, polymer, LCP (liquid crystal polymer) film, or other polymer composite material. Encapsulant 130 extends over back surface 132 of semiconductor die 124, opposite active surface 129. Encapsulant 130 is non-conductive and environmentally protects the semiconductor device from external elements and contaminants.

Figure 3D:
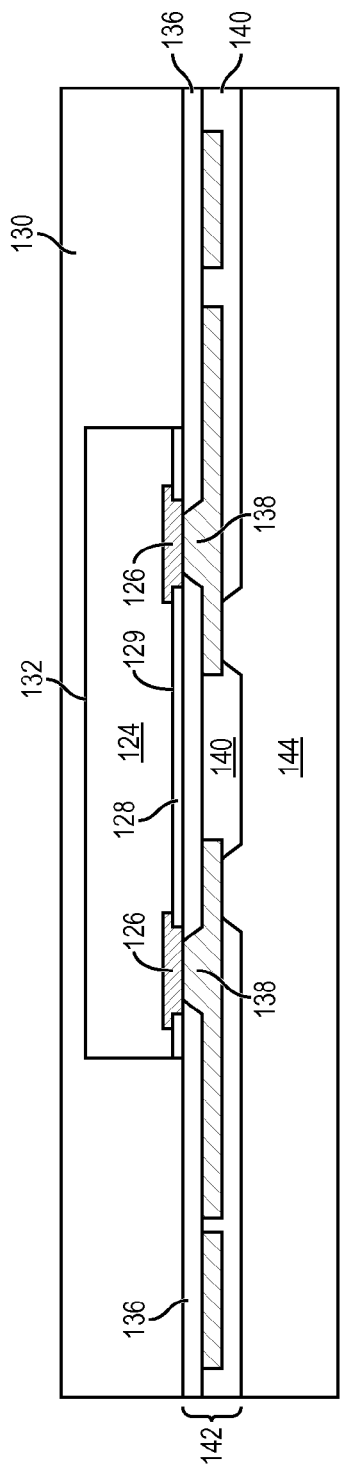

In FIG. 3d, carrier 120 and interface layer 122 is removed by chemical etching, mechanical peel-off, CMP, mechanical grinding, thermal bake, laser scanning, or wet stripping. An optional insulating or passivation layer 136 is formed over encapsulant 130 and semiconductor die 124 using PVD, CVD, printing, spin coating, spray coating, lamination, or thermal oxidation. The insulating layer 136 can be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), low-temperature cured (less than 250° C.) polymer dielectric, ultra violet (UV) light curable polymer dielectric, dry film polymer dielectric, or other material having similar insulating and structural properties. A portion of insulating layer 136 is removed by developing, etching, or laser drilling process to expose contact pads 126, or other material having similar insulating and structural properties. A portion of insulating layer 136 is removed by developing, etching, or laser drilling process to expose contact pads 126.

An electrically conductive layer 138 is formed over insulating layer 136 and contact pads 126 using patterning and PVD, CVD, electrolytic plating, electroless plating process, or other suitable metal deposition process. Conductive layer 138 can be one or more layers of Al, Cu, Sn, Ni, Au, Ag, or other suitable electrically conductive material. Conductive layer 138 is electrically connected to contact pads 126 of semiconductor die 124 and operates as a redistribution layer (RDL) to extend the electrical connectivity for semiconductor die 124. RDL 138 has a fine pitch, less than 30 micrometers (μm).

An insulating or passivation layer 140 is formed over insulating layer 136 and conductive layer 138 using PVD, CVD, printing, spin coating, spray coating, lamination, or thermal oxidation. The insulating layer 140 can be one or more layers of $SiO_2$, $Si_3N_4$, SiON, $Ta_2O_5$, $Al_2O_3$, low-temperature cured (less than 250° C.) polymer dielectric, UV light curable polymer dielectric, dry film polymer dielectric, or other material having similar insulating and structural properties. A portion of insulating layer 140 is removed by developing, etching, or laser drilling process to expose conductive layer 138. The insulating layers 136 and 140 and conductive layer 138 constitute a build-up interconnect structure 142. A temporary carrier 144, such as high temperature tape (100° to 250° C.) glass, Si, foil, or adhesive, is formed, bonded, or laminated over insulating layer 140 and conductive layer 138 for structural support.

Figure 3E:
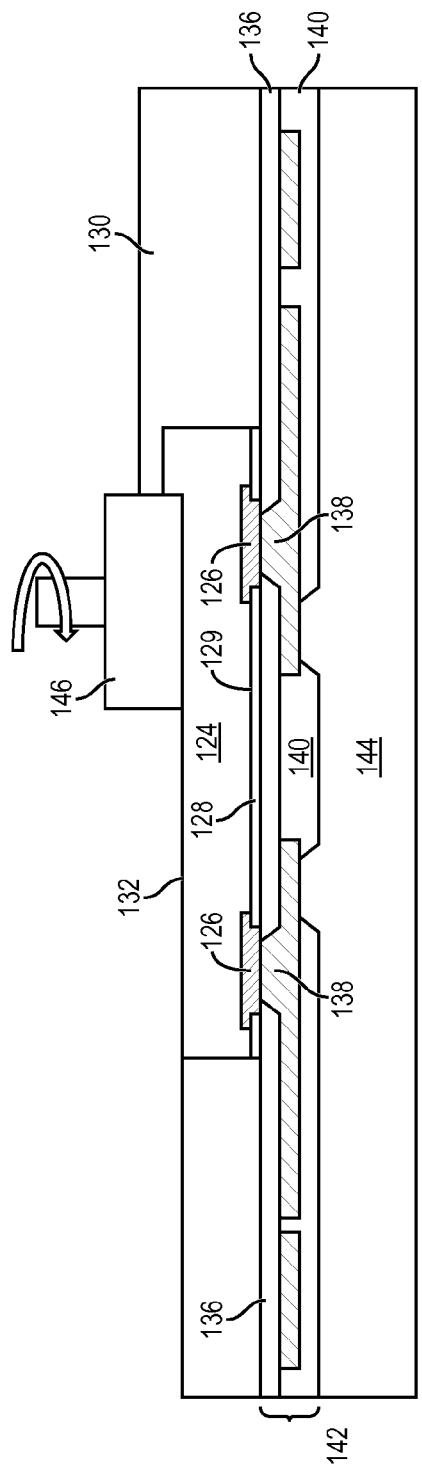

In FIG. 3e, grinder 146 removes a portion of encapsulant 130 and bulk material from back surface 132 of semiconductor die 124 to a die thickness of less than 300 μm. The back surface 132 of semiconductor die 124 is co-planar with a top surface of encapsulant 130 following the grinding process, as shown in FIG. 3f. In another embodiment, the back grinding can occur after encapsulation in FIG. 3c, or the back grinding is omitted leaving encapsulant 130 over back surface 132 of semiconductor die 124.

In FIG. 3g, an insulating or passivation layer 150 is formed over encapsulant 130 and back surface 132 of semiconductor die 124 using PVD, CVD, printing, spin coating, spray coating, lamination or thermal oxidation. The insulating layer 150 can be one or more layers of $SiO_2$, $Si_3N_4$, SiON, $Ta_2O_5$, $Al_2O_3$, low-temperature cured (less than 250° C.) polymer dielectric, UV light curable polymer dielectric, dry film polymer dielectric, or other material having similar insulating and structural properties. In cases where encapsulant 130 remains over semiconductor die 124, insulating layer 150 can be omitted.

An electrically conductive layer 152 is formed over insulating layer 150 using patterning and PVD, CVD, electrolytic plating, electroless plating process, or other suitable metal deposition process. Conductive layer 152 can be one or more layers of Al, Cu, Sn, Ni, Au, Ag, or other suitable electrically conductive material. Conductive layer 152 operates as an RDL to extend the electrical connectivity. RDL 152 is capable of having a fine line/space, less than 30 μm.

An insulating or passivation layer 154 is formed over insulating layer 150 and conductive layer 152 using PVD, CVD, printing, spin coating, spray coating, lamination, or thermal oxidation. The insulating layer 154 can be one or more layers of $SiO_2$, $Si_3N_4$, SiON, $Ta_2O_5$, $Al_2O_3$, low-temperature cured (less than 250° C.) polymer dielectric, UV light curable polymer dielectric, dry film polymer dielectric, or other material having similar insulating and structural properties. A portion of insulating layer 154 is removed by developing, etching, or laser drilling process to expose conductive layer 152. The insulating layers 150 and 154 and conductive layer 152 constitute a build-up interconnect structure 156.

In another embodiment, encapsulant 130 undergoes back grinding while semiconductor die 124 is mounted to carrier 120 and insulating layer 150 is formed prior to build-up interconnect structure 142. Alternatively, no back grinding is performed and the portion of encapsulant 130 extending over back surface 132 of semiconductor die 124 serves as insulating layer 150.

Figure 3H:
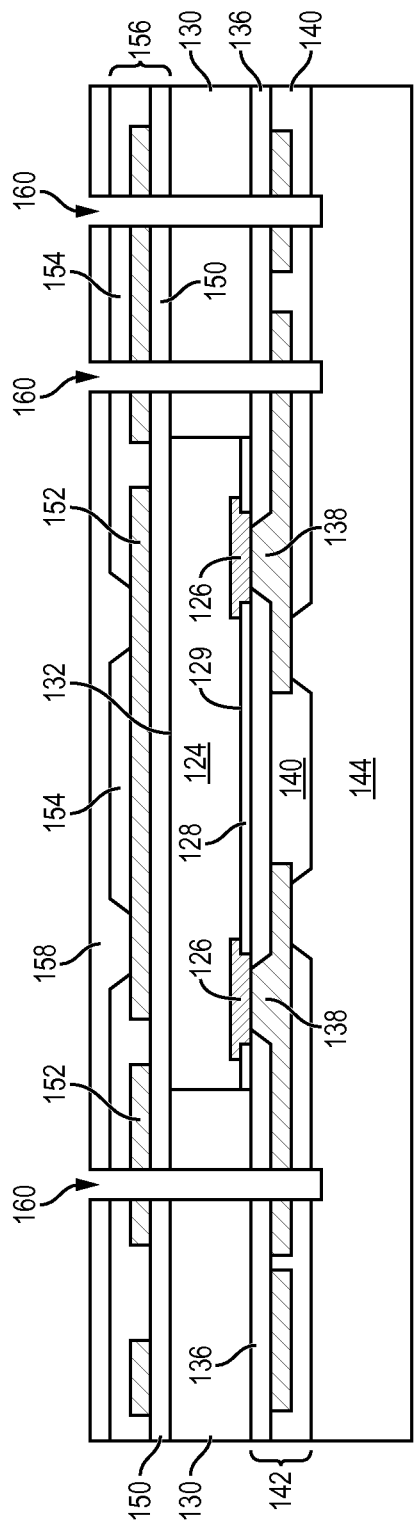

In FIG. 3h, a protective layer 158 is formed over insulating layer 154. Protective layer 158 can be water rinseable material, such as Hogomax 002. A plurality of vias 160 is formed through protective layer 158, build-up interconnect structure 156, encapsulant 130, and build-up interconnect structure 142 and partially into carrier 144 using laser drilling, mechanical drilling, or deep reactive ion etching (DRIE). Protective layer 158 protects the entry of vias 160 into build-up interconnect structure 156 and carrier 144 protects the exit of vias 160 from build-up interconnect structure 142.

Figure 3I:
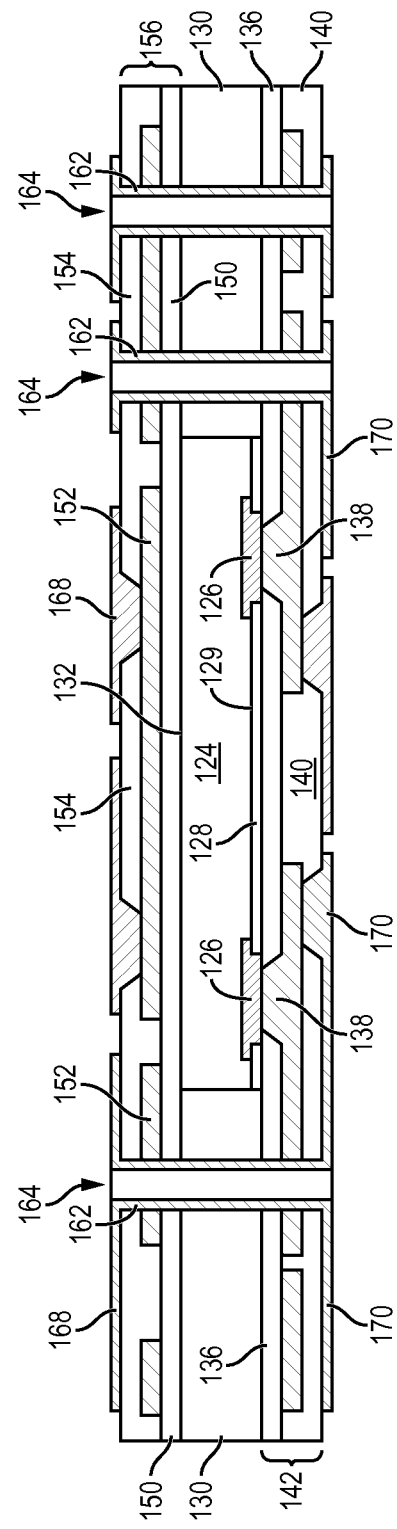

In FIG. 3i, carrier 144 and protective layer 158 are removed following formation of vias 160 by an etching or substrate cleaning process. An electrically conductive layer 162 is formed in vias 160 as conductive vias 164. In one embodiment, conductive vias 164 are formed on the sidewalls of vias 160. Alternatively, conductive layer 162 completely fills vias 160. An optional electrically conductive layer 168 is formed over insulating layer 154 and electrically connected to conductive vias 164. An optional electrically conductive layer 170 is formed over insulating layer 140 and electrically connected to conductive vias 164. Conductive layers 162, 168, and 170 are formed using etch back or selective patterning and PVD, CVD, electrolytic plating, electroless plating process, or other suitable metal deposition process. In one embodiment, conductive layers 162, 168, and 170 use the same double plating process of electroless Cu plating followed by electrolytic Cu plating at the same time to reduce cost. Conductive layers 162, 168, and 170 can also be one or more layers of Al, Cu, Sn, Ni, Au, Ag, or other suitable electrically conductive material.

Figure 3J:
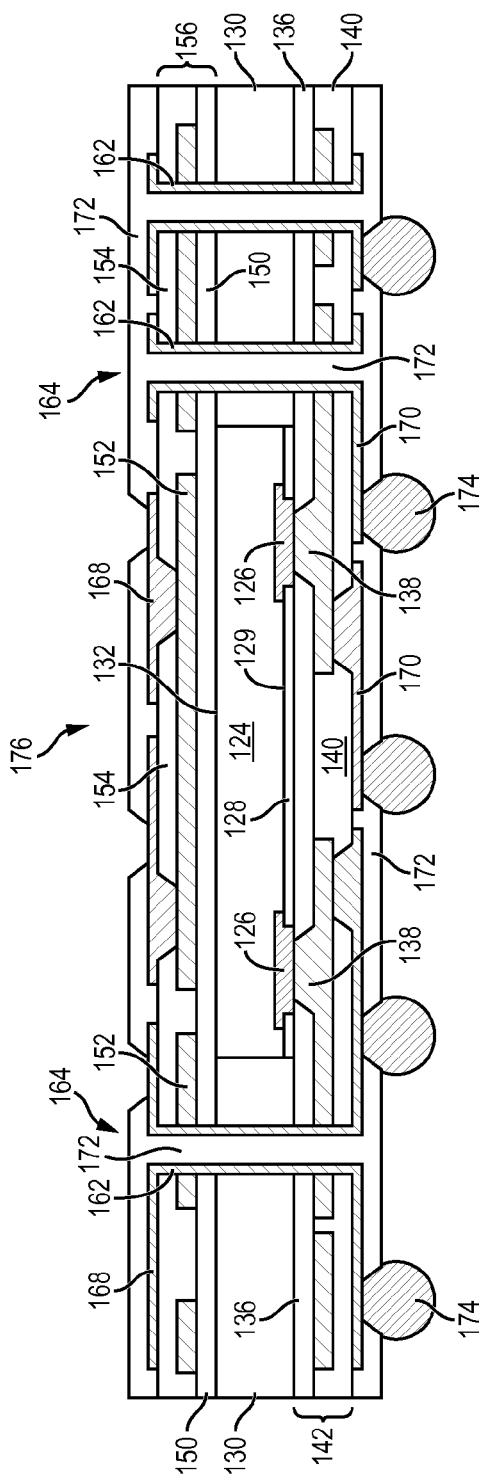

In FIG. 3j, an insulating or passivation layer 172 is formed in vias 160 and over conductive layers 168 and 170 using PVD, CVD, spin coating, spray coating, lamination, or thermal oxidation. The vias 160 may use vacuum filling for a complete insulation fill. The insulating layer 172 can be one or more layers of SiO2, Si3N4, SiON, Ta2O5, Al2O3, low-temperature cured (less than 250° C.) polymer dielectric, UV light curable polymer dielectric, dry film polymer dielectric, or other material having similar insulating and structural properties. A portion of insulating layer 172 is removed by developing, etching, or laser drilling process to expose conductive layers 168 and 170.

An electrically conductive bump material is deposited over conductive layer 170 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 170 using a suitable attachment or bonding process. In one embodiment, the bump material is reflowed by heating the material above its melting point to form spherical balls or bumps 174. In some applications, bumps 174 are reflowed a second time to improve electrical contact to conductive layer 170. The bumps can also be compression bonded to conductive layer 170. Bumps 174 represent one type of interconnect structure that can be formed over conductive layer 170. The interconnect structure can also use bond wires, conductive paste, stud bump, micro bump, or other electrical interconnect.

In WLCSP 176, build-up interconnect structure 156 is electrically connected through conductive vias 164 to build-up interconnect structure 142 and semiconductor die 124. Conductive vias 164 are formed by laser drilling or mechanical drilling with protective layers over the entry points and exit points. Conductive layers 162, 168, and 170 use same double Cu plating process at the same time to reduce cost.

Figure 4:
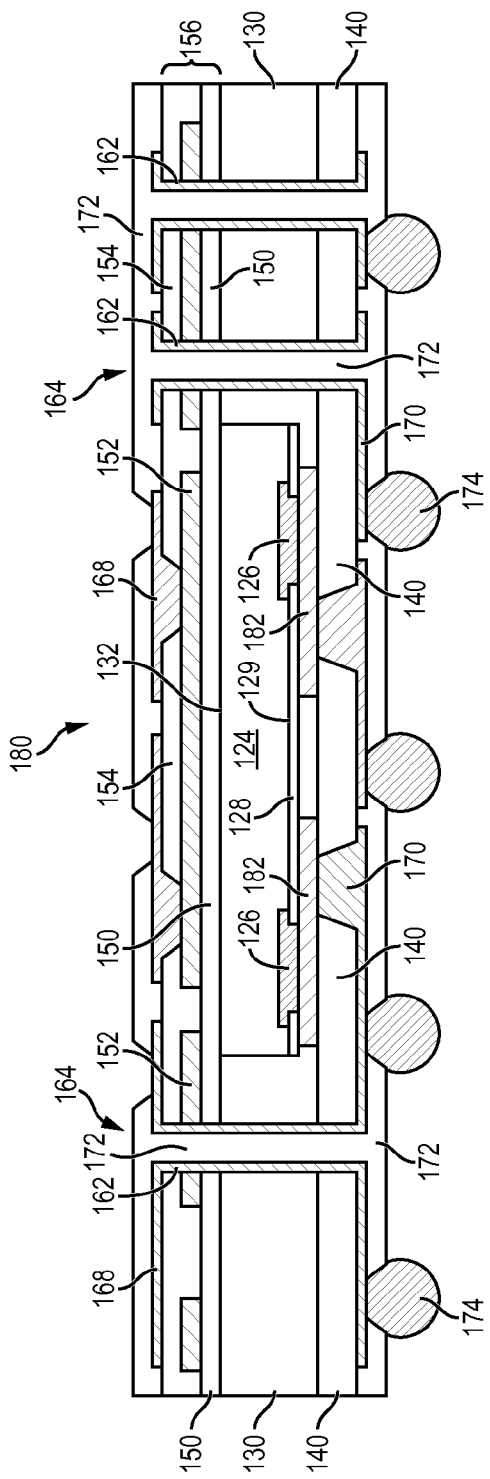
FIG. 4 illustrates the conductive vias through the WLCSP with one-side fine pitch RDL.

FIG. 4 shows WLCSP 180 similar to the features of FIG. 3j with RDL 182 formed on contact pads 126 and active surface 129, prior to mounting to carrier 120 in FIG. 3b. WLCSP 180 follows a similar process described in FIGS. 3b-3j, less formation of insulating layer 136 and conductive layer 138. In this case, the fine pitch RDL 152 is formed in build-up interconnect structure 156 on one side of semiconductor die 124. The build-up interconnect structure 142 has no fine pitch RDL.

Figure 5:
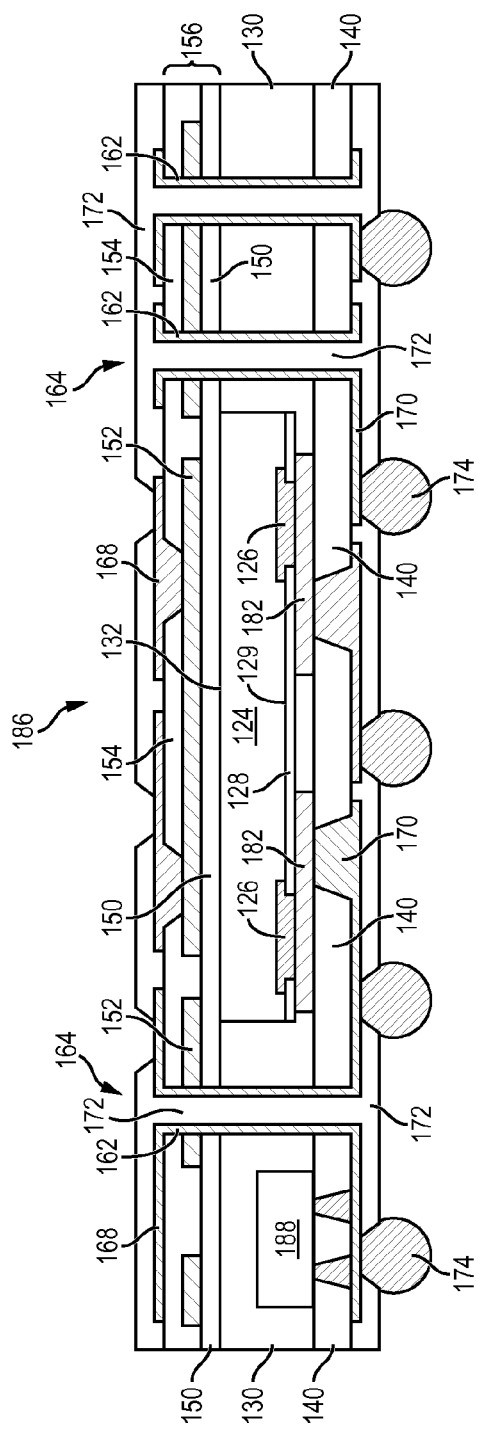
FIG. 5 illustrates a discrete semiconductor package mounted to the WLCSP.

FIG. 5 shows WLCSP 186 similar to the features described in FIG. 4 with discrete semiconductor component 188 mounted and electrically connected to conductive layer 170. Discrete semiconductor component 188 can be active devices, such as transistors and diodes, or passive devices, such as capacitors, resistors, and inductors.

FIGS. 6a-6d illustrate a process of forming the conductive vias from the bottom-side of the lower build-up interconnect structure. Continuing from FIG. 3d, a plurality of vias 190 is formed through carrier 144, build-up interconnect structure 142, and encapsulant 130 using laser drilling, mechanical drilling, or DRIE. Carrier 144 protects the entry of vias 190 into build-up interconnect structure 142 and encapsulant 130 protects the exit of vias 160 from build-up interconnect structure 142.

Figure 6A:
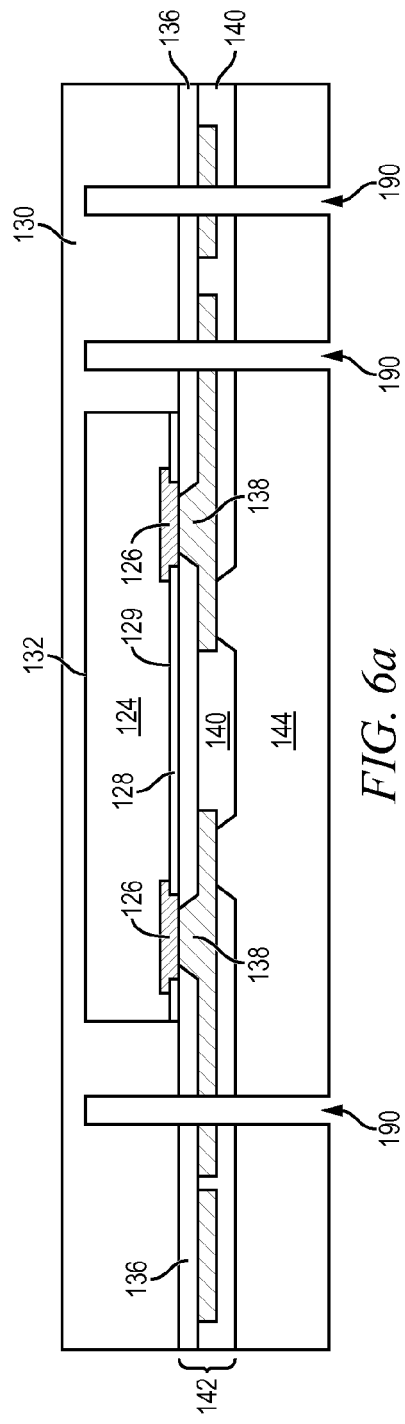
FIGS. 6a-6d illustrate a process of forming the conductive vias from the bottom-side of the lower build-up interconnect structure.
Figure 6B:
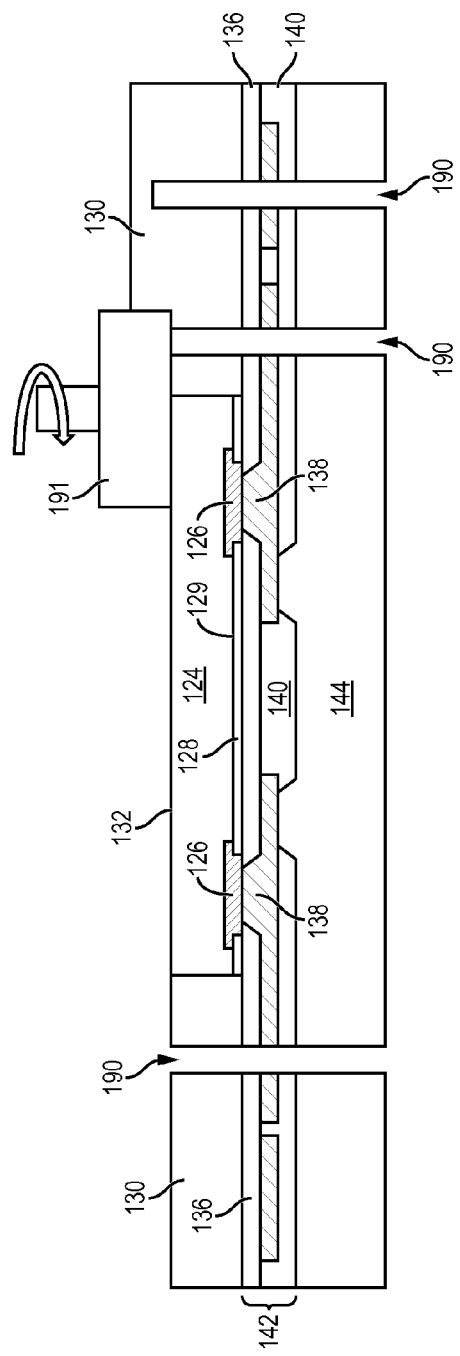

In FIG. 6b, grinder 191 removes a portion of encapsulant 130 to open vias 190.

Figure 6C:
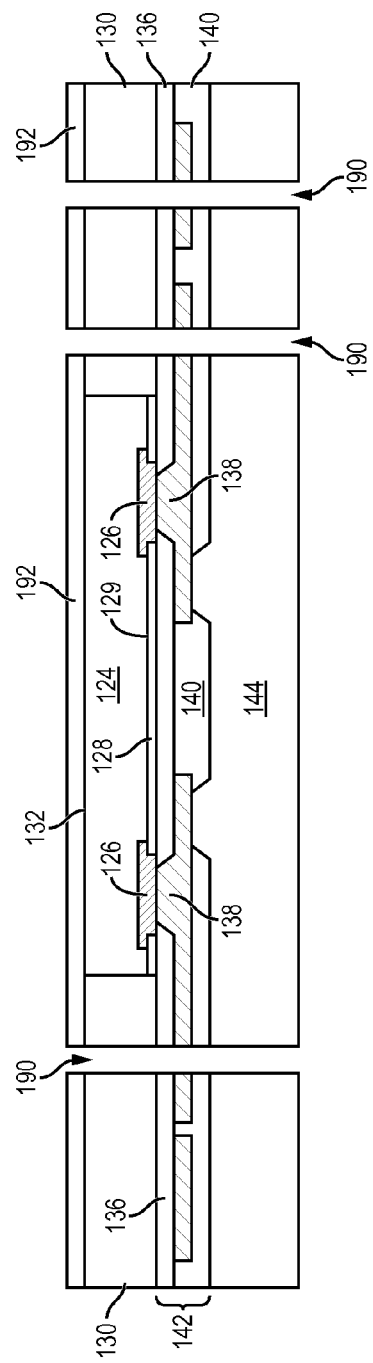

In FIG. 6c, an optional insulating or passivation layer 192 is formed over encapsulant 130 and back surface 132 of semiconductor die 124 using PVD, CVD, printing, spin coating, spray coating, lamination, or thermal oxidation. The insulating layer 192 can be one or more layers of SiO2, Si3N4, SiON, Ta2O5, Al2O3, low-temperature cured (less than 250° C.) polymer dielectric, UV light curable polymer dielectric, dry film polymer dielectric, or other material having similar insulating and structural properties. Alternatively, the back grinding process may leave a portion of encapsulant 130 remaining over back surface 132 of semiconductor die 124 as the backside insulating layer.

Figure 6D:
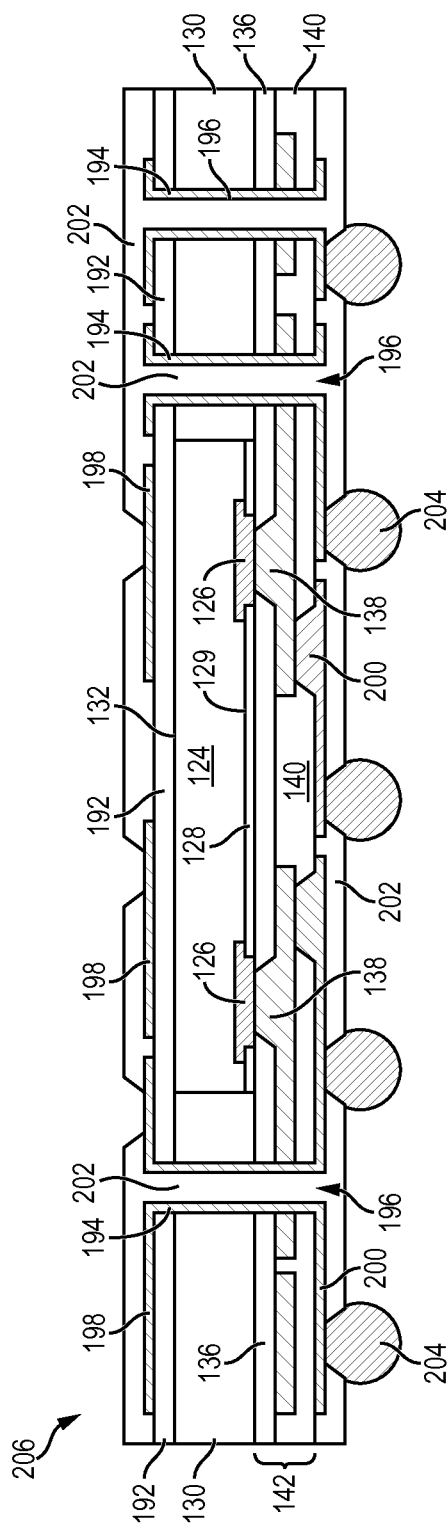

In FIG. 6d, carrier 144 is removed by an etching, peeling, or stripping process. An electrically conductive layer 194 is formed in vias 190 as conductive vias 196. In one embodiment, conductive vias 196 are formed on the sidewalls of vias 190. Alternatively, conductive layer 194 completely fills vias 190. An electrically conductive layer 198 is formed over insulating layer 192 and electrically connected to conductive vias 196. An electrically conductive layer 200 is formed over insulating layer 140 and electrically connected to conductive vias 196. Conductive layers 194, 198, and 200 are formed using etch back or selective patterning and PVD, CVD, electrolytic plating, electroless plating process, or other suitable metal deposition process. In one embodiment, conductive layers 194, 198, and 200 use the same double plating process of electroless Cu plating followed by electrolytic Cu plating at the same time to reduce cost. Conductive layers 194, 198, and 200 can also be one or more layers of Al, Cu, Sn, Ni, Au, Ag, or other suitable electrically conductive material.

An insulating or passivation layer 202 is formed in vias 190 and over conductive layers 198 and 200 using PVD, CVD, spin coating, spray coating, lamination, or thermal oxidation. The vias 190 may use vacuum filling for a complete insulation fill. The insulating layer 202 can be one or more layers of SiO2, Si3N4, SiON, Ta2O5, Al2O3, low-temperature cured (less than 250° C.) polymer dielectric, UV light curable polymer dielectric, dry film polymer dielectric, or other material having similar insulating and structural properties. A portion of insulating layer 202 is removed by developing, etching, or laser drilling process to expose conductive layers 198 and 200.

An electrically conductive bump material is deposited over conductive layer 200 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 200 using a suitable attachment or bonding process. In one embodiment, the bump material is reflowed by heating the material above its melting point to form spherical balls or bumps 204. In some applications, bumps 204 are reflowed a second time to improve electrical contact to conductive layer 200. The bumps can also be compression bonded to conductive layer 200. Bumps 204 represent one type of interconnect structure that can be formed over conductive layer 200. The interconnect structure can also use bond wires, conductive paste, stud bump, micro bump, or other electrical interconnect.

In WLCSP 206, conductive layer 198 is electrically connected through conductive vias 196 to build-up interconnect structure 142 and semiconductor die 124. Conductive vias 196 are formed by laser drilling or mechanical drilling with protective layers over the entry points and exit points. Conductive layers 194, 198, and 200 use the same double Cu plating process at the same time to reduce cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a carrier;
    providing a semiconductor die;
    disposing a first interconnect structure over an active surface of the semiconductor die;
    disposing the semiconductor die over the carrier with the active surface of the semiconductor die oriented toward the carrier;
    forming a second interconnect structure over a second surface of the semiconductor die opposite the active surface;
    forming a first insulating layer over the second interconnect structure;
    forming a protective layer on the first insulating layer;
    forming a via in order through the protective layer, second interconnect structure, first interconnect structure, and partially into the carrier;
    removing the protective layer after forming the via;
    removing the carrier after forming the via;
    forming a first conductive layer in the via and extending over the semiconductor die directly on a major surface of the first insulating layer; and
    forming an opening in the first insulating layer, wherein the first conductive layer extends into the opening to contact the second interconnect structure.

2. The method of claim 1, wherein the protective layer includes a water rinseable material.

3. The method of claim 1, further including disposing an encapsulant around the semiconductor die.

4. The method of claim 1, further including forming a second insulating layer over the first interconnect structure and first conductive layer.

5. The method of claim 1, wherein forming the first interconnect structure includes:
    forming a second insulating layer over the semiconductor die; and
    forming a second conductive layer over the second insulating layer.

6. The method of claim 1, further including forming a second insulating layer within the via and extending over the active surface and second surface of the semiconductor die.

7. A method of making a semiconductor device, comprising:
    providing a support layer;
    providing a semiconductor die;
    disposing a first interconnect structure over a first surface of the semiconductor die;
    disposing the semiconductor die over the support layer with the first surface of the semiconductor die oriented toward the support layer;
    forming a second interconnect structure over a second surface of the semiconductor die opposite the first surface of the semiconductor die;
    forming a first insulating layer over the second interconnect structure;
    forming a protective layer in contact with the first insulating layer;
    forming a via in order through the protective layer, second interconnect structure, and first interconnect structure;
    removing the protective layer after forming the via;
    removing the support layer after forming the via; and
    forming a first conductive layer in the via.

8. The method of claim 7, further including forming a second insulating layer within the via and extending over the first surface and second surface of the semiconductor die.

9. The method of claim 7, further including forming a second conductive layer over the first interconnect structure using a common metal deposition step with the first conductive layer.

10. The method of claim 7, wherein the protective layer includes a water rinseable material.

11. The method of claim 7, wherein the first surface of the semiconductor die is an active surface of the semiconductor die.

12. The method of claim 7, wherein the via extends into the support layer.

13. A method of making a semiconductor device, comprising:
    providing a semiconductor die;
    providing a support layer;
    disposing the semiconductor die over the support layer;
    forming a first interconnect structure over a first surface of the semiconductor die opposite the support layer;
    forming a first insulating layer over the first interconnect structure;
    forming a protective layer in contact with the first insulating layer;
    forming a via extending through the protective layer and first interconnect structure;
    removing the protective layer after forming the via;
    removing the support layer after forming the via;
    forming a conductive layer within the via and extending over the first interconnect structure; and
    forming a second insulating layer extending through the via and over the first surface of the semiconductor die and over a second surface opposite the first surface in a single vacuum filling process step.

14. The method of claim 13, further including forming the conductive layer using a double plating process.

15. The method of claim 13, wherein the protective layer includes a water rinseable material.

16. The method of claim 13, wherein the via extends into the support layer.

17. The method of claim 13, further including disposing an encapsulant around the semiconductor die.

18. The method of claim 13, further including disposing a second interconnect structure over the semiconductor die opposite the first interconnect structure.

19. The method of claim 18, wherein the via extends through the second interconnect structure.

20. A method of making a semiconductor device, comprising:
    providing a support layer;
    providing a semiconductor die;
    disposing a first conductive layer over a first surface of the semiconductor die;
    disposing the semiconductor die over the support layer with the first surface of the semiconductor die oriented toward the support layer;
    forming a second conductive layer over a second surface of the semiconductor die opposite the first surface;
    forming a first insulating layer over the second conductive layer;
    forming a protective layer in contact with the first insulating layer;
    forming a via through the protective layer, second conductive layer, and first conductive layer;
    removing the protective layer after forming the via;
    removing the support layer after forming the via; and
    forming a third conductive layer in the via.

21. The method of claim 20, wherein the protective layer includes a water rinseable material.

22. The method of claim 20, further including disposing an encapsulant around the semiconductor die.

23. The method of claim 20, further including forming a second insulating layer over the third conductive layer.

24. The method of claim of 20, further including forming a second insulating layer within the via.

25. The method of claim 20, wherein the via extends into the support layer.

* * * * *